(12) United States Patent
Schaller et al.

(10) Patent No.: US 12,315,747 B2
(45) Date of Patent: May 27, 2025

(54) WORKPIECE HANDLING ARCHITECTURE FOR HIGH WORKPIECE THROUGHPUT

(71) Applicant: Applied Materials, Inc., Santa Clara, CA (US)

(72) Inventors: Jason M. Schaller, Austin, TX (US); Michael Carrell, Leander, TX (US); William T. Weaver, Austin, TX (US); Charles T. Carlson, Cedar Park, TX (US)

(73) Assignee: Applied Materials, Inc., Santa Clara, CA (US)

( * ) Notice: Subject to any disclaimer, the term of this patent is extended or adjusted under 35 U.S.C. 154(b) by 309 days.

(21) Appl. No.: 17/977,417

(22) Filed: Oct. 31, 2022

(65) Prior Publication Data

US 2024/0145270 A1    May 2, 2024

(51) Int. Cl.
    *H01L 21/67*        (2006.01)
    *H01L 21/677*      (2006.01)
    *H01L 21/687*      (2006.01)

(52) U.S. Cl.
    CPC .. *H01L 21/67201* (2013.01); *H01L 21/67718* (2013.01); *H01L 21/68707* (2013.01)

(58) Field of Classification Search
    CPC ......... H01L 21/67161; H01L 21/67703; H01L 21/68707; H01L 21/67718; H01L 21/67201; H01L 21/67171
    See application file for complete search history.

(56) References Cited

U.S. PATENT DOCUMENTS

| | | | |
|---|---|---|---|
| 5,486,080 A * | 1/1996 | Sieradzki | H01L 21/67161 414/217 |
| 2007/0196011 A1 | 8/2007 | Cox et al. | |
| 2008/0075563 A1 | 3/2008 | McLane | |
| 2009/0252578 A1 | 10/2009 | Machida | |
| 2014/0178157 A1 | 6/2014 | Hofmeister et al. | |
| 2015/0206782 A1 | 7/2015 | Caveney et al. | |
| 2019/0237351 A1 | 8/2019 | Krupyshev et al. | |

(Continued)

FOREIGN PATENT DOCUMENTS

EP          1422742 A2     5/2004

OTHER PUBLICATIONS

International Search Report and Written Opinion mailed Dec. 29, 2023 in corresponding PCT application No. PCT/US2023/032516.

(Continued)

*Primary Examiner* — Kaitlin S Joerger
(74) *Attorney, Agent, or Firm* — Nields, Lemack & Frame, LLC

(57) ABSTRACT

A system for transferring semiconductor workpieces from a load lock to an orientation station and on to a platen is disclosed. The system comprises two load locks, two robots, and one orientation station. Each robot is associated with a respective load lock and follows a fixed sequence. The robot returns a processed workpiece to the load lock and also removes an unprocessed workpiece. The robot then moved to the orientation station, where it removes an aligned workpiece from the orientation station and deposits the unprocessed workpiece on the orientation station. Next, the robot moves to the platen, where it removes a processed workpiece and deposits the aligned workpiece. The robot then returns to the load lock and repeats this sequence.

16 Claims, 5 Drawing Sheets

(56) References Cited

U.S. PATENT DOCUMENTS

2020/0161152 A1   5/2020  Caveney et al.
2021/0020476 A1   1/2021  Harbert et al.
2024/0145271 A1   5/2024  Schaller et al.

OTHER PUBLICATIONS

Office Action mailed Nov. 4, 2024 in co-pending U.S. Appl. No. 17/977,422.
Notice of Allowance mailed Apr. 9, 2025 in co-pending U.S. Appl. No. 17/977,422.

\* cited by examiner

WORKPIECE HANDLING ARCHITECTURE FOR HIGH WORKPIECE THROUGHPUT

FIELD

Embodiments relate to a system for achieving high workpiece throughput, and more specifically, higher throughput for semiconductor workpieces as they are processed.

BACKGROUND

Ions are used in a plurality of semiconductor processes, such as implantation, amorphization, deposition and etching processes. These semiconductor processes are typically performed in a process chamber, which is maintained at near vacuum conditions.

Before a semiconductor workpiece can be processed, it is transported from an ambient environment to the process chamber. Further, after being transported to the process chamber, the semiconductor workpiece is typically aligned in a specific orientation.

To achieve this sequence, one or more load locks are used to transition the workpieces to and from the process chamber. Additionally, an orientation station is typically used to align the workpiece to the desired orientation. After these two processes are completed, the workpiece can then be mounted on the platen for processing.

Often, the transfer of workpieces from the load lock to the orientation station and on to the platen may represent a bottleneck in the semiconductor process. For example, the processing of a workpiece on the platen may take less than 5 seconds, which ideally allows the processing of at least 720 workpieces per hour. However, traditional transport systems limit the throughput to roughly 500 workpieces per hour.

Therefore, it would be beneficial if there was a system that transported workpieces between the load lock and the platen such that the semiconductor processing became the bottleneck in the process.

SUMMARY

A system for transferring semiconductor workpieces from a load lock to an orientation station and on to a platen is disclosed. The system comprises two load locks, two robots, and one orientation station. Each robot is associated with a respective load lock and follows a fixed sequence. The robot returns a processed workpiece to the load lock and also removes an unprocessed workpiece. The robot then moved to the orientation station, where it removes an aligned workpiece from the orientation station and deposits the unprocessed workpiece on the orientation station. Next, the robot moves to the platen, where it removes a processed workpiece and deposits the aligned workpiece. The robot then returns to the load lock and repeats this sequence.

According to one embodiment, a system for transporting workpieces to a platen is disclosed. The system comprises two load locks; two robots, each associated with a respective load lock and each having two arms which are capable of independently retracting and extending; and an orientation station, for aligning each workpiece prior to being placed on the platen. In some embodiments, each robot repetitively executes a sequence, wherein the sequence comprises: moving to the respective load lock; using a first arm of the two arms to place a processed workpiece in the respective load lock and using a second arm of the two arms to remove an unprocessed workpiece; moving to the orientation station; using the first arm to remove an aligned workpiece from the orientation station and using the second arm to place the unprocessed workpiece on the orientation station; moving to the platen; and using the second arm to remove a processed workpiece from the platen and using the first arm to place the aligned workpiece on the platen. In certain embodiments, a second robot of the two robots executes the sequence, and is delayed as compared to the sequence executed by a first robot of the two robots. In some embodiments, a first robot of the two robots removes an unprocessed workpiece from a first load lock of the two load locks and places the unprocessed workpiece on the orientation station, and wherein a second robot of the two robots removes the unprocessed workpiece from the orientation station after alignment. In some embodiments, a first robot of the two robots removes an aligned workpiece from orientation station and places the aligned workpiece on the platen, and wherein a second robot of the two robots removes the aligned workpiece from the platen after processing. In some embodiments, the two load locks each have a stacked configuration, with two independent chambers. In certain embodiments, each independent chamber holds 2 or 3 workpieces. In some embodiments, the two arms of each robot are fixed in a yaw direction. In some embodiments, the system further comprises a plurality of front opening unified pods (FOUPs) and an atmospheric robot disposed in an ambient environment, wherein the atmospheric robot transfers workpieces between the two load locks and the FOUPs. In certain embodiments, the atmospheric robot has a 1+N pick arrangement, enabling the atmospheric robot to transfer 1, N or N+1 workpieces at a time between the FOUPs and the two load locks.

According to another embodiment, a method of transferring workpieces between a plurality of load locks and a platen is disclosed. The method comprises executing a sequence of processes, the sequence comprising: placing a processed workpiece in one of the plurality of load locks and removing an unprocessed workpiece; removing an aligned workpiece from an orientation station and placing the unprocessed workpiece on the orientation station; and removing a processed workpiece from the platen and placing the aligned workpiece on the platen. In some embodiments, the sequence is repeated a plurality of times. In some embodiments, the sequence is executed by a first robot. In some embodiments, the sequence is also executed by a second robot, and is delayed as compared to the sequence executed by the first robot. In certain embodiments, the first robot removes the unprocessed workpiece from a first load lock of the plurality of load locks and places the unprocessed workpiece on the orientation station, and wherein the second robot removes the unprocessed workpiece from the orientation station after alignment. In certain embodiments, the second robot removes an aligned workpiece from orientation station and places the aligned workpiece on the platen, and wherein the first robot removes the aligned workpiece from the platen after processing. In some embodiments, the first robot transfers workpieces to and from a first of the plurality of load locks and the second robot transfers workpieces to and from a second of the plurality of load locks. In some embodiments, the plurality of load locks each have a stacked configuration, with two independent chambers.

BRIEF DESCRIPTION OF THE FIGURES

For a better understanding of the present disclosure, reference is made to the accompanying drawings, which are incorporated herein by reference and in which.

DETAILED DESCRIPTION

Figure 1:
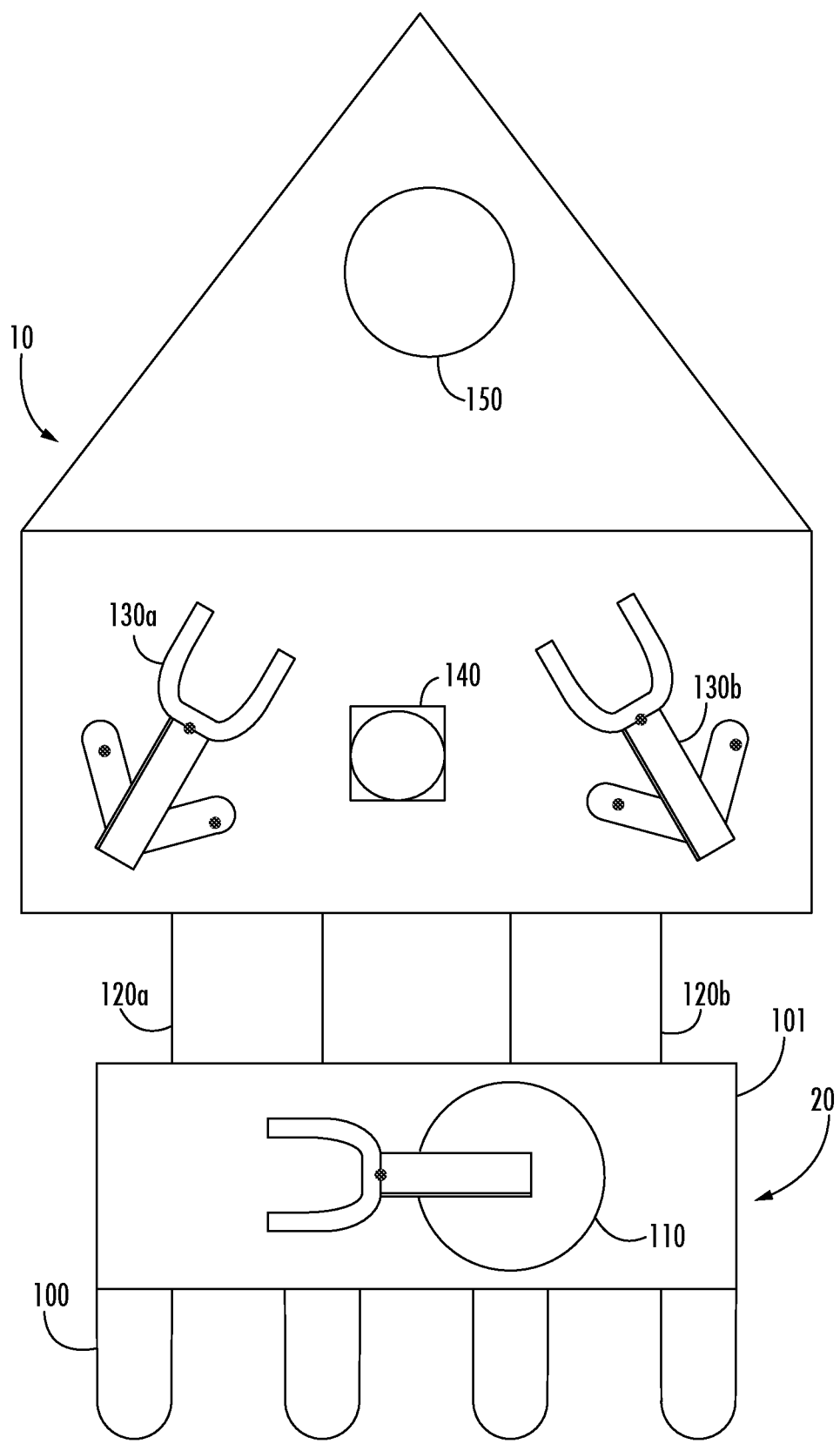
FIG. 1 shows the system for transporting workpieces according to one embodiment.

FIG. 1 shows one embodiment of a system for transporting workpieces. The system includes a plurality of FOUPs 100 (front opening unified pods). An EFEM 101 (Equipment Front End Module) includes an atmospheric robot 110 that is used to remove and replace workpieces from the FOUPs 100. The atmospheric robot 110 may have a 2+1 pick arrangement to enable it to transfer 1, 2 or 3 workpieces per exchange. In other words, the atmospheric robot 110 has two separately controllable arms, also referred to as dual yaw. In this embodiment, one of the arms has two picks that move together and the second arm has one pick. In another embodiment, the atmospheric robot 110 may have a 1+1 pick arrangement to enable it to transfer 1 or 2 workpieces per exchange. In another embodiment, the atmospheric robot 110 may have a 1+N pick arrangement, where N is 1 or greater.

The atmospheric robot 110 is used to move workpieces between the FOUPs 100 and the load locks 120*a*, 120*b*. In this figure, there are two load locks, a first load lock 120*a* and a second load lock 120*b*. Generally, assuming that the atmospheric robot 110 has a 1+N pick arrangement, the atmospheric robot 110 is able to transfer N+1, N or 1 workpieces at a time.

The load locks 120*a*, 120*b* are used to separate the process chamber 10 from the ambient environment 20.

Figure 2:
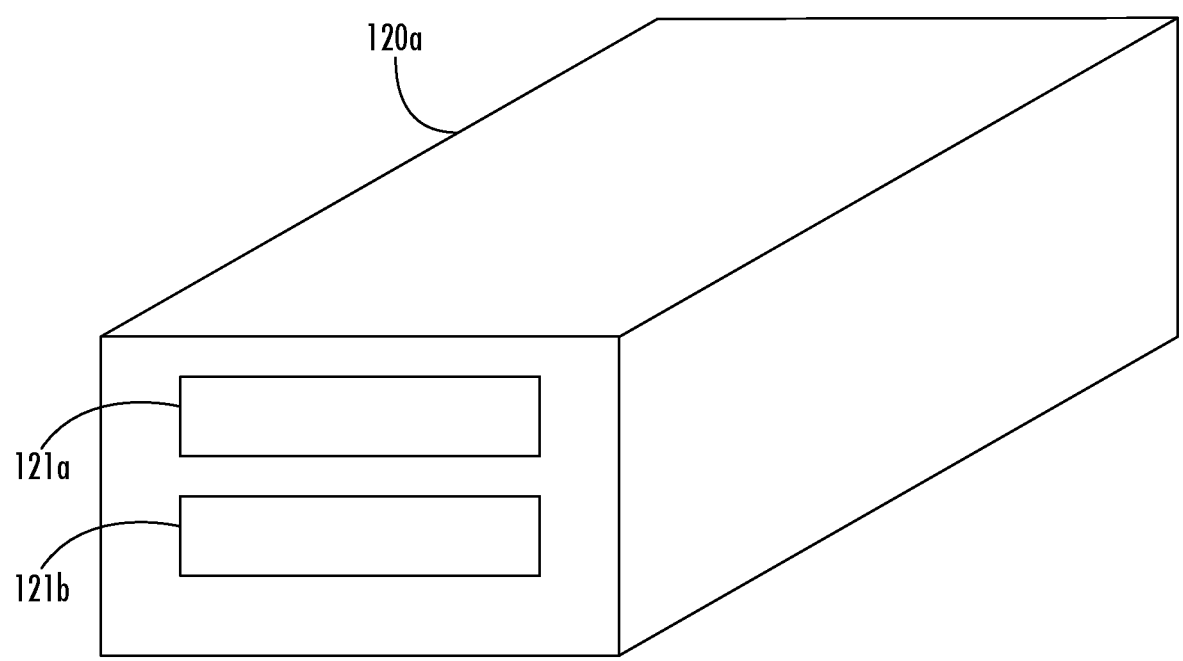
FIG. 2 shows a load lock according to one embodiment.

In one embodiment, shown in FIG. 2, the load locks 120*a*, 120*b* may each be a stacked configuration. Thus, each load lock 120*a*, 120*b* comprises two separately controllable chambers 121*a*, 121*b*. In this way, the first chamber 121*a* of the first load lock 120*a* may be open to the process chamber 10 while the second chamber 121*b* may or may not be open to the process chamber 10. In this way, one chamber may be presenting unprocessed workpieces to the process chamber 10 while the second chamber may be returning processed workpieces to the ambient environment 20.

Each chamber of the load lock may be capable of holding a number of workpieces. In one embodiment, each chamber holds 2 workpieces. In another embodiment, each chamber may hold 3 workpieces. Of course, the chamber may hold more workpieces, if desired.

Figure 3:
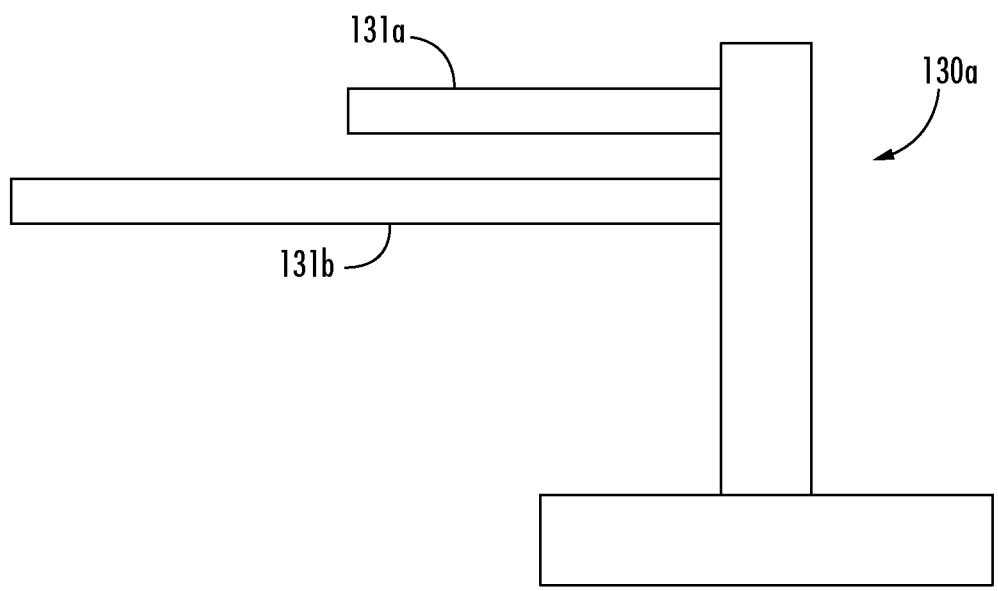
FIG. 3 shows a side view of the multi-pick robot according to one embodiment.

Disposed in the process chamber 10 are two robots 130*a*, 130*b*. The two robots 130*a*, 130*b* may be SCARA (Selective Compliance Articulated Robotic Arm) type robots, capable of movement in the height direction, the radial direction and rotation in the yaw direction. In one embodiment, the robots 130*a*, 130*b* each have two arms that are fixed in the yaw direction. These arms are capable of independently extending and retracting. Thus, although the arms rotate and move in the height direction in unison, they are capable of independent movement in the radial direction. FIG. 3 shows a side view of the first robot 130*a*, showing the first arm 131*a* retracted and the second arm 131*b* extracted. In another embodiment, the robots 130*a*, 130*b* have two arms that may move independently in several axis. In this embodiment, software may be used so that the arms are fixed in the yaw direction. In all embodiments, the robots have two arms that can extend and retract independently.

An orientation station 140 is also disposed in the process chamber 10. The orientation station is used to align the workpiece to a particular orientation. The workpieces typically have a notch located along the edge that identifies the orientation of the workpiece. The orientation station 140 is used to rotate the workpiece until the notch is in a predetermined position. The orientation station 140 in the present system can only align one workpiece at a time. The orientation station 140 uses an alignment mechanism to orient the workpiece. For example, the alignment mechanism may include a sensor, which is used to detect the notch in the workpiece. In some embodiments, the sensor may be a camera. In another embodiment, a light may be disposed on one side of the workpiece. The light may be directed toward the edge of the workpiece and the sensor, located on the opposite side of the workpiece, is used to detect the presence of the notch. The position of the notch is determined based on an increase in the received light by the sensor. Of course, other alignment mechanisms may be used.

The orientation station 140 is located in a position where both the first robot 130*a* and the second robot 130*b* are able to access it.

Beyond the orientation station 140 is the platen 150. The workpiece is placed on platen 150 so that it can be processed. For example, while on the platen 150, the workpiece may be subject to ion implantation, etching or some other process. In some embodiments, the platen may be an electrostatic chuck. Again, the platen is located in a position where both the first robot 130*a* and the second robot 130*b* are able to access it.

Figure 4:
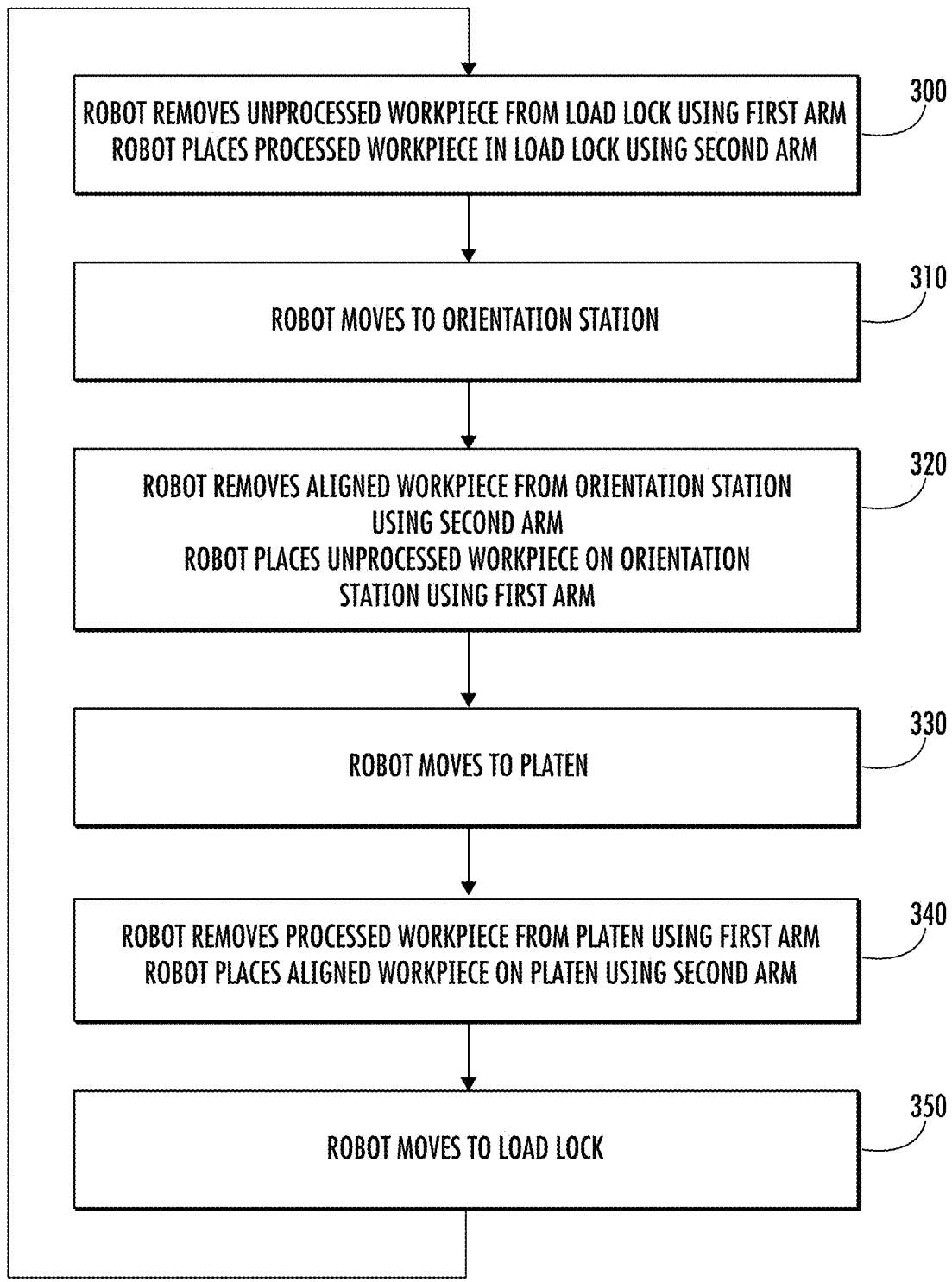
FIG. 4 is a flowchart showing the sequence of operations performed by one robot.

Having described the structure of the system, the operation of each robot will now be explained. Since each robot has two arms, it is capable of manipulating two workpieces at each station. FIG. 4 shows the operation of one robot.

First, as shown in Box 300 of FIG. 4, the first robot 130*a* removes an unprocessed workpiece from the first load lock 120*a* using the first arm 131*a* and also places a processed workpiece in the first load lock 120*a* using the second arm 131*b*.

Next, as shown in Box 310, the first robot 130*a* moves so that it may access the orientation station 140. Once at the orientation station 140, as shown in Box 320, the first robot 130*a* removes an aligned workpiece from the orientation station 140 using the second arm 131*b*. The first robot 130*a* then places the unprocessed workpiece on the orientation station using the first arm 131*a*.

The first robot 130*a* then moves to the platen 150, as shown in Box 330. At the platen 150, as shown in Box 340 the first robot 130*a* removes a processed workpiece from the platen 150 using the first arm 131*a*. The first robot 130*a* then places the aligned workpiece on the platen using the second arm 131*b*.

The first robot 130*a* then moves to the load lock 120*a*, as shown in Box 350. This sequence then repeats.

Note that the second robot 130*b* also executes the same sequence as is shown in FIG. 4, but lags the first robot 130*a*. In this way, the two robots 130*a*, 130*b* cooperate to move workpieces to and from the load locks.

Figure 5:
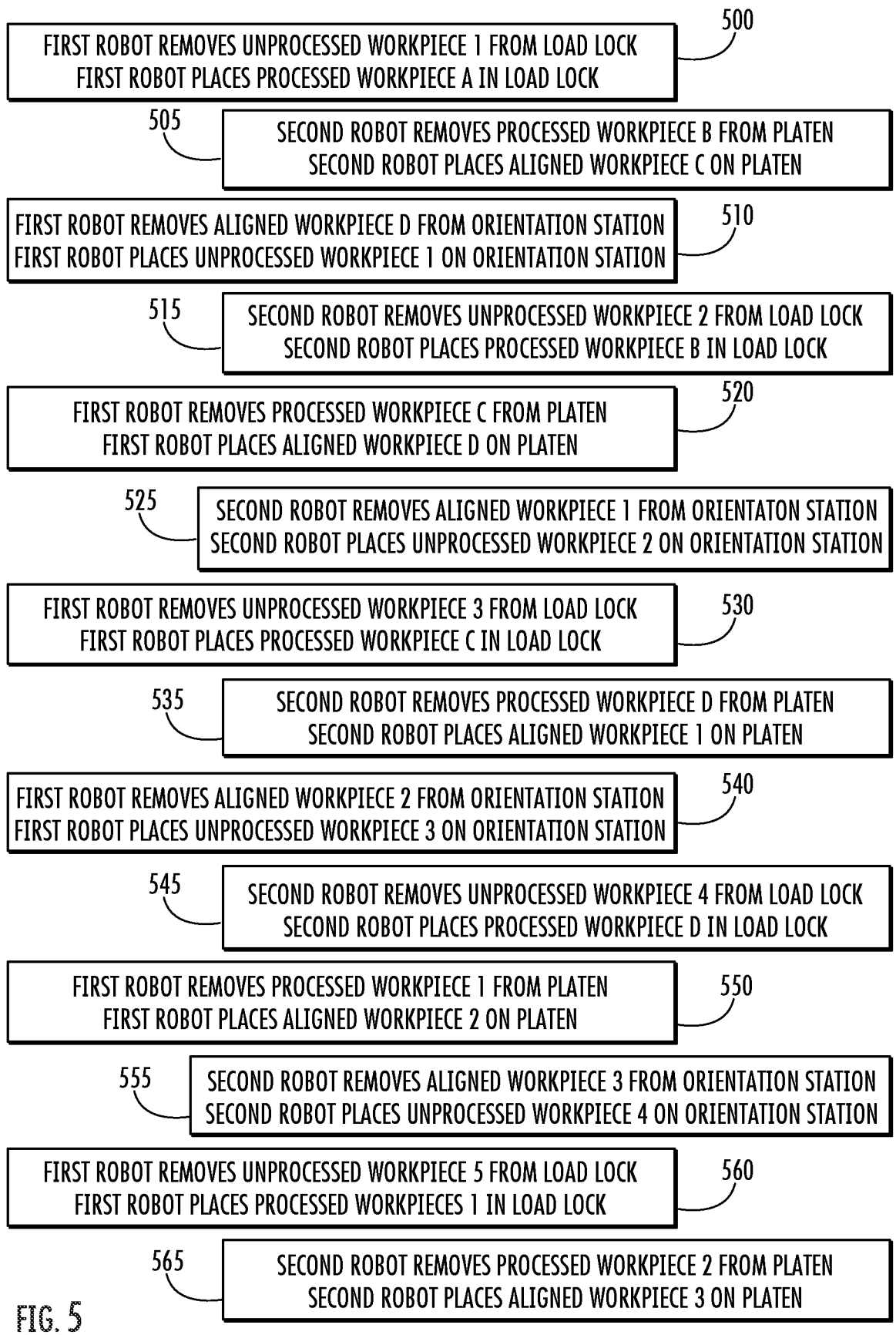
FIG. 5 is a flowchart showing the sequence of operations to process a workpiece and return it to the load lock.

FIG. 5 shows a detailed flowchart showing the sequence of operations performed by the two robots 130*a*, 130*b*. In this example, workpieces that are already in process have been labelled with letters, while workpieces that enter the process chamber during this sequence are labelled using numbers.

When this sequence begins, there are several workpieces already in process chamber 10. These include workpiece A, which is one of the arms of the first robot 130a, workpiece B, which is on the platen 150, workpiece C which is in transit from the orientation station 140 to the platen 150 and workpiece D, which is on the orientation station 140. Thus, the first several processes shown in FIG. 5 include both workpieces that are already in process, as well as new workpieces.

As shown in Box 500, the first robot 130a places a processed workpiece A in the load lock 120a using one of its arms and removes an unprocessed workpiece 1 using the other arm.

At roughly the same time, as shown in Box 505, the second robot 130b removes processed workpiece B from the platen 150 and places aligned workpiece C on the platen 150.

Next, as shown in Box 510, the first robot 130a removes aligned workpiece D from the orientation station 140 and places unprocessed workpiece 1 on the orientation station 140.

At roughly the same time, as shown in Box 515, the second robot 130b places a processed workpiece B in the load lock 120a using one of its arms and removes an unprocessed workpiece 2 using the other arm.

Next, as shown in Box 520, the first robot 130a removes processed workpiece C from the platen 150 and places aligned workpiece D on the platen 150.

At roughly the same time, as shown in Box 525, the second robot 130b removes aligned workpiece 1 from the orientation station 140 and places unprocessed workpiece 2 on the orientation station 140.

As shown in Box 530, the first robot 130a places a processed workpiece C in the load lock 120a using one of its arms and removes an unprocessed workpiece 3 using the other arm.

At roughly the same time, as shown in Box 535, the second robot 130b removes processed workpiece D from the platen 150 and places aligned workpiece 1 on the platen 150.

Next, as shown in Box 540, the first robot 130a removes aligned workpiece 2 from the orientation station 140 and places unprocessed workpiece 3 on the orientation station 140.

At roughly the same time, as shown in Box 545, the second robot 130b places a processed workpiece D in the load lock 120a using one of its arms and removes an unprocessed workpiece 4 using the other arm.

Next, as shown in Box 550, the first robot 130a removes processed workpiece 1 from the platen 150 and places aligned workpiece 2 on the platen 150.

At roughly the same time, as shown in Box 555, the second robot 130b removes aligned workpiece 3 from the orientation station 140 and places unprocessed workpiece 4 on the orientation station 140.

As shown in Box 560, the first robot 130a places a processed workpiece 1 in the load lock 120a using one of its arms and removes an unprocessed workpiece 5 using the other arm.

At roughly the same time, as shown in Box 565, the second robot 130b removes processed workpiece 2 from the platen 150 and places aligned workpiece 3 on the platen 150.

It is noted that Boxes 500, 510, 525, 535, 550 and 560 describe the sequence of operations that workpiece 1 undergoes. Thus, in this embodiment, a workpiece that is removed from the load lock 120a by the first robot 130a is placed on the orientation station 140 by the first robot 130a. That workpiece is then removed from the orientation station 140 by the second robot 130b and placed on the platen 150. Finally, that workpiece is then removed by the first robot 130a and returned to the load lock 120a. In this way, the workpiece is return to the load lock from whence it originated. Further, in this embodiment, the robot that places an unprocessed workpiece on the orientation station 140 is not the same as the robot that removes the aligned workpiece from that orientation station 140. Additionally, the robot that places the aligned workpiece on the platen 150 is not the same as the robot that removes the processed workpiece from the platen 150.

The present apparatus has many advantages. By utilizing two SCARA robots with two arms that can extend and retract independently, it is possible to dramatically improve the throughput of the system. In certain tests, throughputs in excess of 900 workpieces per hours may be achieved. Further, if the desired throughput is lower, such as 650 workpieces per hour, the robots may be able to move more slowly. In fact, in certain embodiments, the robots may more slowly at high throughput than current existing systems. This improves handling reliability and the time between preventative maintenance.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A system for transporting workpieces to a platen, comprising:
   two load locks;
   two robots, each associated with a respective load lock and each having two arms which are capable of independently retracting and extending; and
   an orientation station, for aligning each workpiece prior to being placed on the platen, wherein each robot executes a sequence, wherein the sequence comprises:
   moving to the respective load lock;
   using a first arm of the two arms to place a processed workpiece in the respective load lock and using a second arm of the two arms to remove an unprocessed workpiece;
   moving to the orientation station;
   using the first arm to remove an aligned workpiece from the orientation station and using the second arm to place the unprocessed workpiece on the orientation station;
   moving to the platen; and
   using the second arm to remove a processed workpiece from the platen and using the first arm to place the aligned workpiece on the platen.

2. The system of claim 1, wherein a second robot of the two robots executes the sequence, and is delayed as compared to the sequence executed by a first robot of the two robots.

3. The system of claim 1, wherein a first robot of the two robots removes an unprocessed workpiece from a first load lock of the two load locks and places the unprocessed workpiece on the orientation station, and wherein a second robot of the two robots removes the unprocessed workpiece from the orientation station after alignment.

4. The system of claim 1, wherein a first robot of the two robots removes an aligned workpiece from the orientation station and places the aligned workpiece on the platen, and wherein a second robot of the two robots removes the aligned workpiece from the platen after processing.

5. The system of claim 1, wherein the two load locks each have a stacked configuration, with two independent chambers.

6. The system of claim 5, wherein each independent chamber holds 2 or 3 workpieces.

7. The system of claim 1, wherein the two arms of each robot are fixed in a yaw direction.

8. The system of claim 1, further comprising a plurality of front opening unified pods (FOUPs) and an atmospheric robot disposed in an ambient environment, wherein the atmospheric robot transfers the workpieces between the two load locks and the FOUPs.

9. The system of claim 8, wherein the atmospheric robot has a 1+N pick arrangement, enabling the atmospheric robot to transfer 1, N or N+1 workpieces at a time between the FOUPs and the two load locks.

10. A method of transferring workpieces between a plurality of load locks and a platen, comprising:
   using a first robot to execute a sequence of processes, the sequence comprising:
   placing a processed workpiece in one of the plurality of load locks and removing an unprocessed workpiece;
   removing an aligned workpiece from an orientation station and placing the unprocessed workpiece on the orientation station; and
   removing a processed workpiece from the platen and placing the aligned workpiece on the platen.

11. The method of claim 10, further comprising repeating the sequence a plurality of times.

12. The method of claim 10, wherein the sequence is also executed by a second robot, and is delayed as compared to the sequence executed by the first robot.

13. The method of claim 12, wherein the first robot removes the unprocessed workpiece from a first load lock of the plurality of load locks and places the unprocessed workpiece on the orientation station, and wherein the second robot removes the unprocessed workpiece from the orientation station after alignment.

14. The method of claim 13, wherein the second robot the removes aligned workpiece from the orientation station and places the aligned workpiece on the platen, and wherein the first robot removes the aligned workpiece from the platen after processing.

15. The method of claim 12, wherein the first robot transfers the workpieces to and from a first of the plurality of load locks and the second robot transfers the workpieces to and from a second of the plurality of load locks.

16. The method of claim 10, wherein the plurality of load locks each have a stacked configuration, with two independent chambers.

* * * * *